(12) United States Patent
Gibboney, Jr.

(10) Patent No.: US 9,033,777 B1
(45) Date of Patent: May 19, 2015

(54) UNIVERSAL HOLIDAY TREE STAND WITH BUILT-IN HEAT PUMP

(71) Applicant: CHRISTMAS NORTHEAST, INC., Trumbull, CT (US)

(72) Inventor: James W. Gibboney, Jr., Conyers, GA (US)

(73) Assignee: Christmas Northeast, Inc., Trumbull, CT (US)

( * ) Notice: Subject to any disclaimer, the term of this patent is extended or adjusted under 35 U.S.C. 154(b) by 0 days.

(21) Appl. No.: 14/568,373

(22) Filed: Dec. 12, 2014

Related U.S. Application Data

(60) Provisional application No. 62/073,299, filed on Oct. 31, 2014.

(51) Int. Cl.
*A47G 33/06* (2006.01)
*A47G 33/12* (2006.01)
*H05K 7/20* (2006.01)

(52) U.S. Cl.
CPC ............ *A47G 33/12* (2013.01); *H05K 7/20127* (2013.01); *A47G 2033/122* (2013.01)

(58) Field of Classification Search
None
See application file for complete search history.

(56) References Cited

U.S. PATENT DOCUMENTS

| | | | | |
|---|---|---|---|---|
| 2,980,377 A * | 4/1961 | Nielsen et al. | | 248/523 |
| 3,885,763 A * | 5/1975 | Blom | | 47/40.5 |
| 4,397,793 A * | 8/1983 | Stillman et al. | | 261/30 |
| 5,121,897 A * | 6/1992 | Sofy | | 248/527 |
| 5,300,266 A * | 4/1994 | Gibboney, Jr. | | 422/186.07 |
| 5,384,687 A * | 1/1995 | Sano | | 361/689 |
| 5,397,382 A * | 3/1995 | Anderson | | 96/135 |
| 5,517,390 A | 5/1996 | Zins | | |
| 5,625,345 A * | 4/1997 | Stark et al. | | 340/628 |
| 5,820,248 A | 10/1998 | Ferguson | | |
| 5,829,863 A | 11/1998 | Gutshall | | |
| 5,893,547 A * | 4/1999 | Cohen, Jr. | | 248/521 |
| 6,019,165 A | 2/2000 | Batchelder | | |
| 6,085,536 A * | 7/2000 | Evans, Sr. | | 62/259.1 |
| 6,382,582 B1 | 5/2002 | Brown | | |
| 6,648,497 B2 * | 11/2003 | Puleo, Sr. | | 362/568 |
| 6,739,746 B1 * | 5/2004 | Tang | | 362/568 |
| 6,811,836 B1 * | 11/2004 | Johnson et al. | | 428/20 |
| 6,830,365 B2 * | 12/2004 | Kao | | 362/567 |
| 6,918,431 B2 | 7/2005 | Reyzin et al. | | |

(Continued)

FOREIGN PATENT DOCUMENTS

| | | |
|---|---|---|
| DE | 102005045975 A1 | 3/2007 |
| DE | 102007015117 A1 | 8/2008 |
| DE | 202011107724 U1 | 3/2012 |

*Primary Examiner* — Gregory Huson
*Assistant Examiner* — Eric Gorman
(74) *Attorney, Agent, or Firm* — Michael A. Mann; Nexsen Pruet, LLC

(57) ABSTRACT

A tree stand includes a housing dimensioned for holding electronic components used in providing electricity in support of decorative lighting for the tree. The tree stand removes heat from the housing without the use moving parts. Floor vents enable cool air to enter the housing; upper vents enable that air, warmed by the electrical components, to escape to the housing and into a heat riser housing as part of a growing, circular heat thermal. The heat follows a spiral ramp in the heat riser housing exiting vents at the top where additional heat is conducted into the tree itself, radiated into the air. Tree legs can be increased in number or replaced with longer legged trees without tools by insertion of the side wall into a slot formed in the legs and then slid around the circular slide wall from the notch where each leg is inserted.

19 Claims, 6 Drawing Sheets

(56) References Cited

U.S. PATENT DOCUMENTS

| | | |
|---|---|---|
| 6,945,314 B2 | 9/2005 | Farrow et al. |
| 7,040,795 B2 | 5/2006 | Puleo, Sr. |
| 7,168,862 B2 * | 1/2007 | Qi et al. .................. 385/92 |
| 8,132,360 B2 * | 3/2012 | Jin et al. ................ 47/40.5 |
| 8,205,851 B2 | 6/2012 | Hebert |
| 8,276,871 B1 | 10/2012 | Derienzo |
| 8,414,834 B2 | 4/2013 | Gorman |
| 8,569,960 B2 | 10/2013 | Chen |
| 8,870,404 B1 * | 10/2014 | Chen ....................... 362/123 |
| 8,876,321 B2 * | 11/2014 | Chen ....................... 362/123 |
| 2004/0121720 A1 * | 6/2004 | Gautney .................. 454/338 |
| 2004/0137172 A1 * | 7/2004 | Johnson et al. ............ 428/18 |
| 2005/0185398 A1 * | 8/2005 | Scannell .................. 362/227 |
| 2005/0230593 A1 | 10/2005 | Wynn |
| 2005/0241218 A1 * | 11/2005 | Frounfelker .............. 47/31.1 |
| 2008/0236794 A1 | 10/2008 | St. Louis |
| 2009/0050777 A1 | 2/2009 | Odom, Jr. |
| 2013/0119893 A1 * | 5/2013 | Chen ....................... 315/294 |
| 2014/0049948 A1 | 2/2014 | Chen |

* cited by examiner

US 9,033,777 B1

UNIVERSAL HOLIDAY TREE STAND WITH BUILT-IN HEAT PUMP

PRIORITY CLAIM

Benefit is claimed to U.S. Provisional Patent Application 62/073,299, filed Oct. 31, 2014, which is incorporated in its entirety by reference.

BACKGROUND OF THE INVENTION

Technology continues to advances into every endeavor of human activity. Holiday decorations are no exception, particularly the artificial tree portion of the holiday lighting market.

For more than thirty years holiday lighting remained basically unchanged. However, today, technology has found its way into pre-lighted, artificial holiday trees. Unfortunately, problems are arising as electronic technology is applied in this new field. Light-emitting-diode-based lighting, power-efficient incandescent lighting, extra-long-life lighting, hybrid and special effects lighting—all demand new ways of converting, handling, and saving electric power—and all require the new approaches to be implemented successfully and safely. Family safety in the home is of paramount concern.

As the need for new components to manage, control and condition electrical power are realized, there arises the concomitant need for handling the side effects of power management, especially heat. Heat is the primary culprit for causing damage to electrical equipment. Heat, when not properly managed, can also result in smoke damage, even fires, significant impairment of the safe operation of electrical components, or the failure of power supplies, controllers and conditioning electronics.

Therefore, there is a need to address heat, by reducing its generation, and by limiting, isolating, capture, removing, and dissipating heat.

A helpful ally in this regard is the change from 120 VAC power, which is relatively dangerous, to the much safer, controllable DC power, for use in artificial tree lighting systems. New systems for power conversion from AC to DC, and power conditioning, distribution and microprocessor control are essential to the operation of artificial, pre-lighted, holiday trees. Unfortunately, the DC lighting systems have been applied to artificial tree decoration in less-than-optimal ways.

It is the intent of this invention to substantially mitigate the issue of heat and bring to the consumer an enclosed, safer, user-friendly, multi-functional apparatus suitable for supporting artificial holiday trees and their decorative systems.

SUMMARY OF THE INVENTION

The present invention is a tree stand for artificial holiday trees. In the housing of the present tree stand are those electrical components needed to operate lighting and related electrical components used in decorating the tree, such as lighting systems. The decorations, electrical components and the tree are not part of the present invention. The present invention is a heat pump tree stand (HPTS). The term "heat pump" means that the tree stand, in addition to its primary functions of holding the tree by a tree pole and housing the electrical components supporting holiday lighting displayed on the tree, has features that dissipate heat actively rather than passively; that is, it has structures expressly for facilitating heat removal by venting, radiation and conduction. These structures accelerate the dispersion and dissipation of heat from the housing where the electronics are housed, particularly when the tree stand is surrounded by presents, and without the use moving parts, such as fans, motors or working liquids that would add to the heat load. The present tree stand is designed to safely contain electrical power distribution, power management, power conditioning, and power modification and electrical controllers in a protective, electrically-isolating housing while also serving as a universal stand for holding the pole of an artificial holiday tree upright. The present heat pump tree stand housing may be sealed for safety.

The present tree stand includes a heat pump that has no moving parts, no fans, no compressors. It produces no noise and requires no power source. It uses the configuration of the device and its components and the tendency of waste heat produced by the electric components in the housing to rise for the removal and dispersal of that heat.

BRIEF DESCRIPTION OF THE DRAWINGS

In the figures.

DETAILED DESCRIPTION OF PREFERRED EMBODIMENTS

Figure 1:
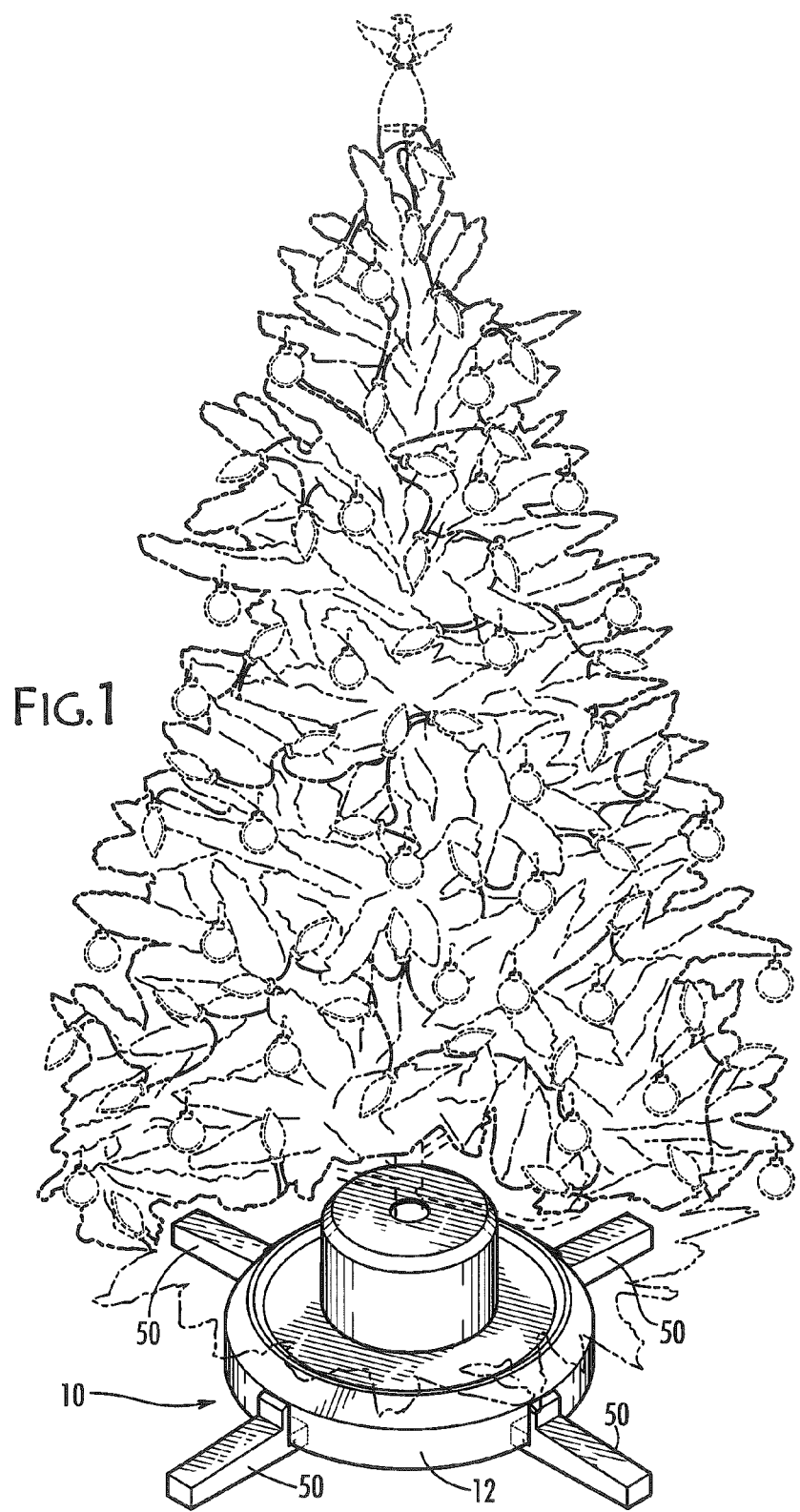
FIG. 1 is a top perspective view of the present tree stand shown in use supporting a decorated tree, according to an embodiment of the present invention.
Figure 2:
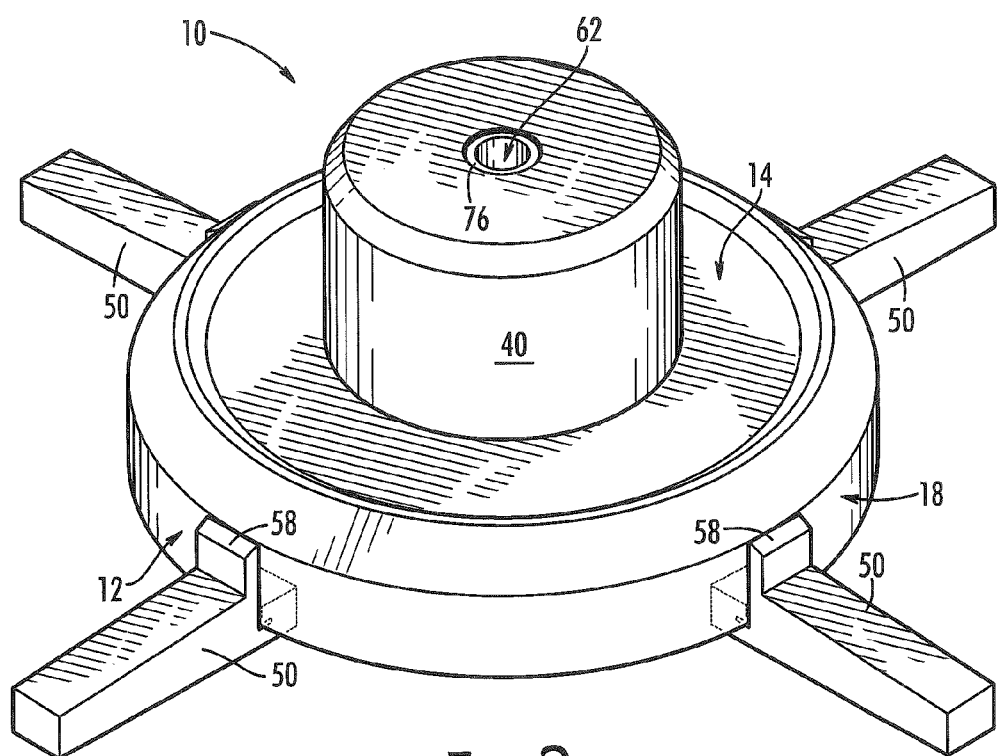
FIG. 2 is a top perspective view of the present tree stand without the tree, according to an embodiment of the invention.

The present invention is a tree stand that includes a housing configured to hold electronic components that support decorative lighting and to hold the tree pole of the tree that displays the decorative electrical lighting. The present tree stand also removes and disperses heat generated by those components.

The terms tree, holiday tree, Christmas tree, and decorative tree as used herein interchangeably refer to an artificial tree in particular but the present invention may also be used with a natural tree, plant or decorative object that may be supported by a stand, particularly a tree, plant, or object that may be illuminated or decorated by lighting supported by components housed within the support.

The term electrical management systems may be used herein to refer to those components that modify electricity for use by decorative signals such as transformers, rectifiers, filters, converters, and other circuits for conditioning electrical power and electrical signals.

When electrical management systems are mounted internally in the present heat pump tree stand (HPTS) housing and are operating, their natural operational inefficiencies generate heat. As these systems warm and their heat begins to accumulate, they generate still more heat from internal losses. This escalating heat rate spreads throughout the interior of HPTS housing producing two effects: 1) internal air pressure increases relative to that outside the housing; and 2) the interior heat-laden air rises on top of the cooler air drawn in from the floor below the HPTS housing.

The electrical management components and the tree are not part of the present invention.

Referring now to the figures and to FIGS. 1-5 in particular, the present HTPS is shown and generally indicated by reference number 10. HTPS 10 includes a housing 12 that has a top surface 14, a bottom plate 16 and a side wall 18. Side wall 18 is preferably curved for greater strength. Top surface 14, bottom plate 16, and side wall 18 define a generally enclosed interior except for central holes 19 and radial holes 20, 22, in top surface 14 and bottom plate 16, respectively, for receiving upper and lower vents 24, 26, respectively.

Figure 3:
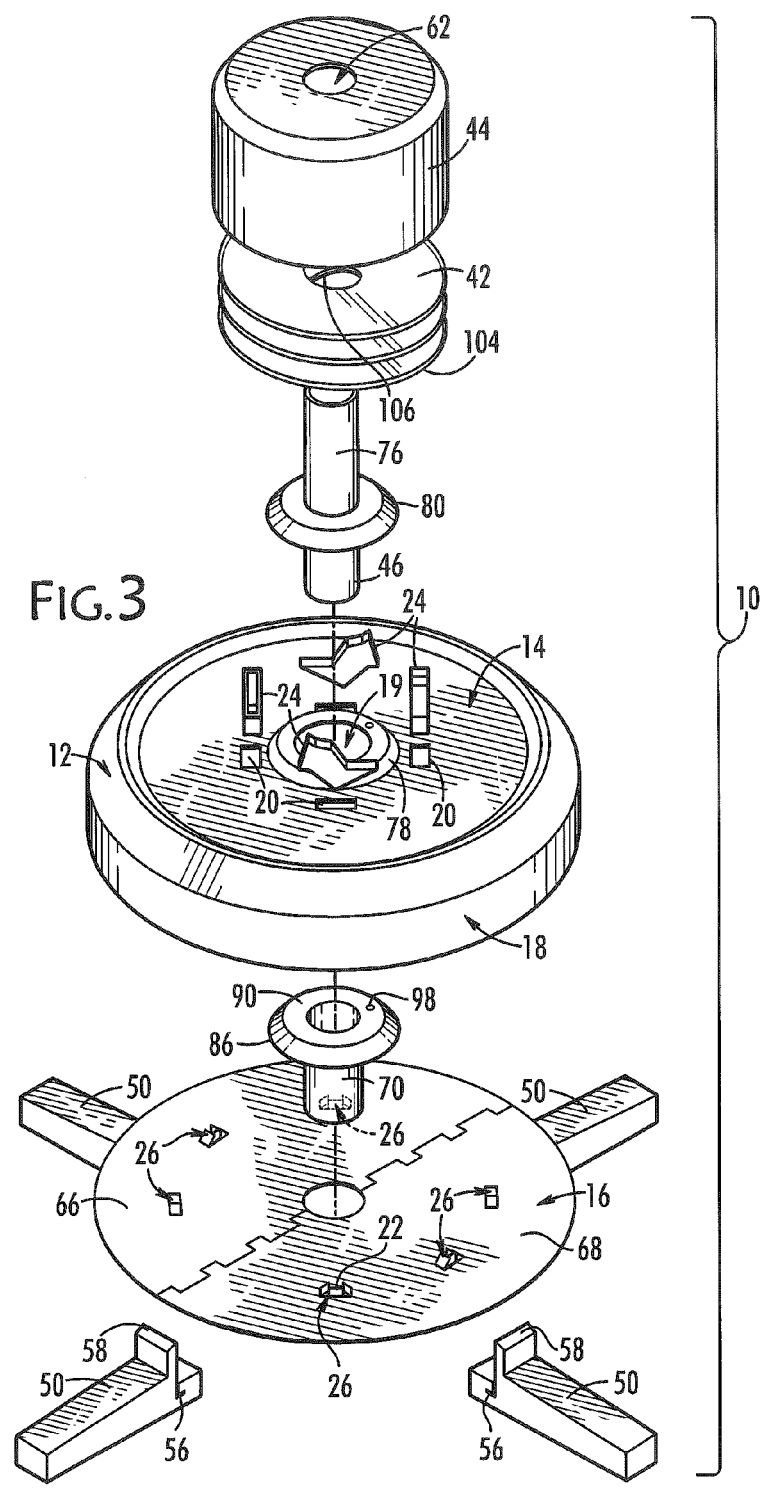
FIG. 3 is an exploded, perspective view of the tree stand of FIG. 1.
Figure 4:
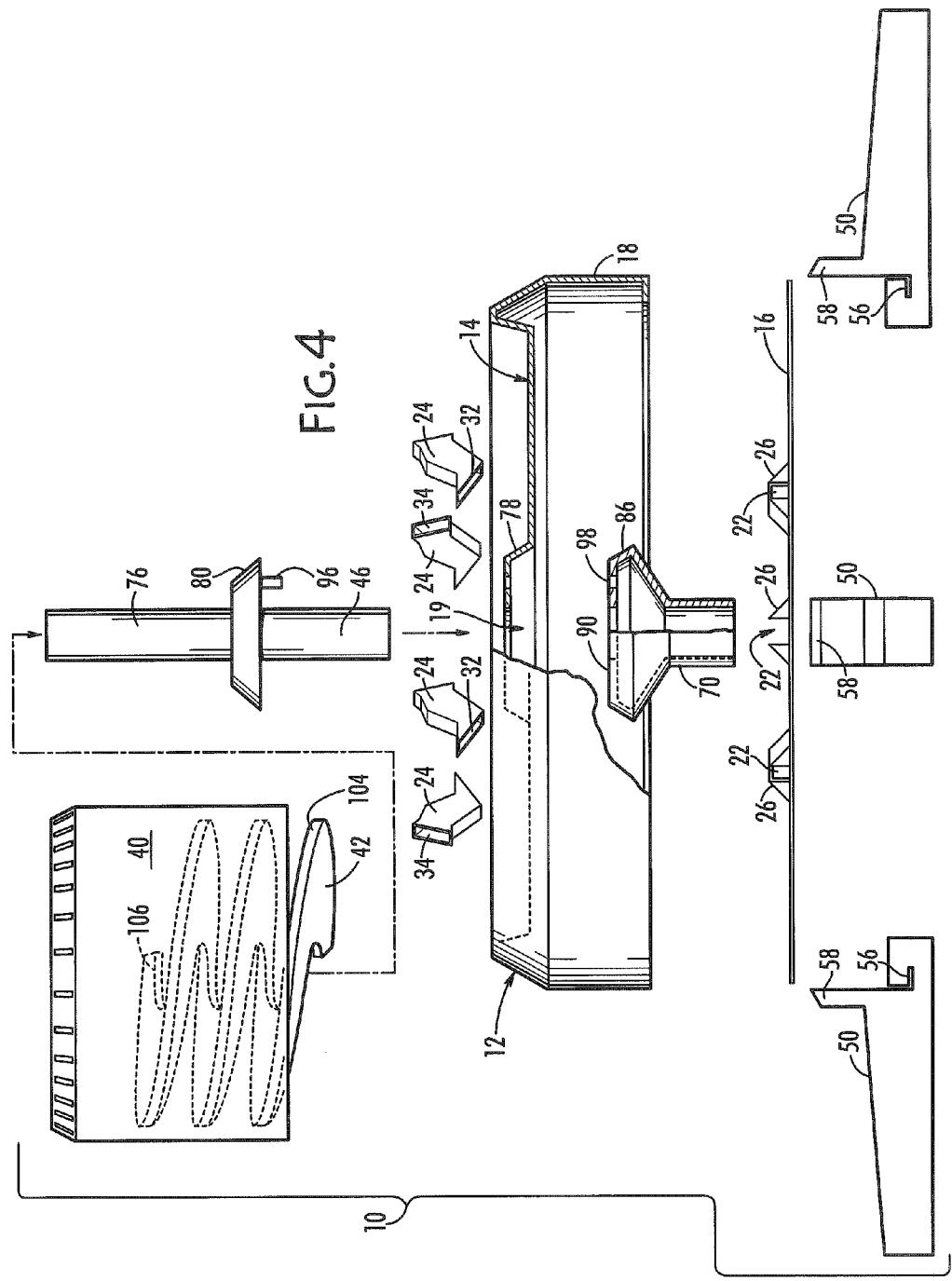
FIG. 4 is an exploded, partially cut-away, side perspective view of the tree stand of FIG. 1.
Figure 5:
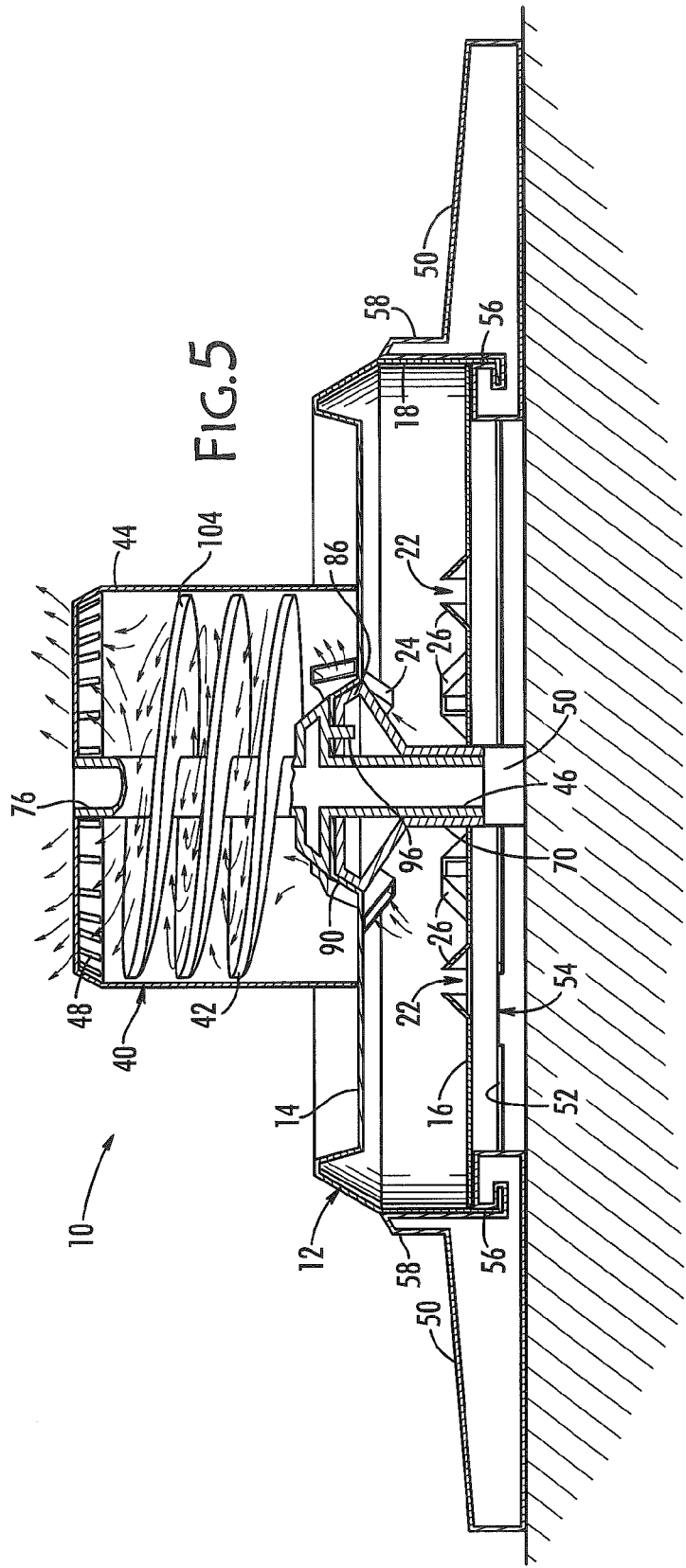
FIG. 5 is side, cross sectional view of the tree stand of FIG. 1, according to an embodiment of the present invention.

Plural upper vents 24 are best seen in FIGS. 3-5. The shape of these vents 24 is essential to the heat pump operation. They define directional passages between their inlet 32 on the interior of the housing 12 and their exit 34 outside of housing 12 where an external, second stage of the heat pump referred to as a heat pump riser 40 receives that directed flow of heat. As air from the interior of housing 12 absorbs heat, its air pressure relative to the external air pressure of housing 12 increases. This high pressure drives the heat-expanded, less viscous, lighter, warm air up and through upper vents 24, which are highly directional, and into heat pump riser 40. Upper vents 24 cooperated to create a circular and upward flow of air from housing 12. Each drives air tangential to housing 12 from its exit 34 and each receives air from the one behind it that it drives upward.

Upper vents 24 may be made of plastic and are inserted by rotating them into position. These vents 24 slip into rectangular punched holes 20 in top surface 14 of housing 12 and, after being rotated fully, snap into position. Once in position, they are locked in place. In particular, the end of upper vent 24 is inserted into hole 20 in housing 12. Next, upper vent 24 is rotated clockwise until it cannot be further rotated, at which point it seats in top surface 14 and locks in place. The arrangement of upper vents 24 and their inlets 32 and exits 34 create a circular flow of the warm air coming from within housing 12 that continues into heat pump riser 40.

Figure 6:
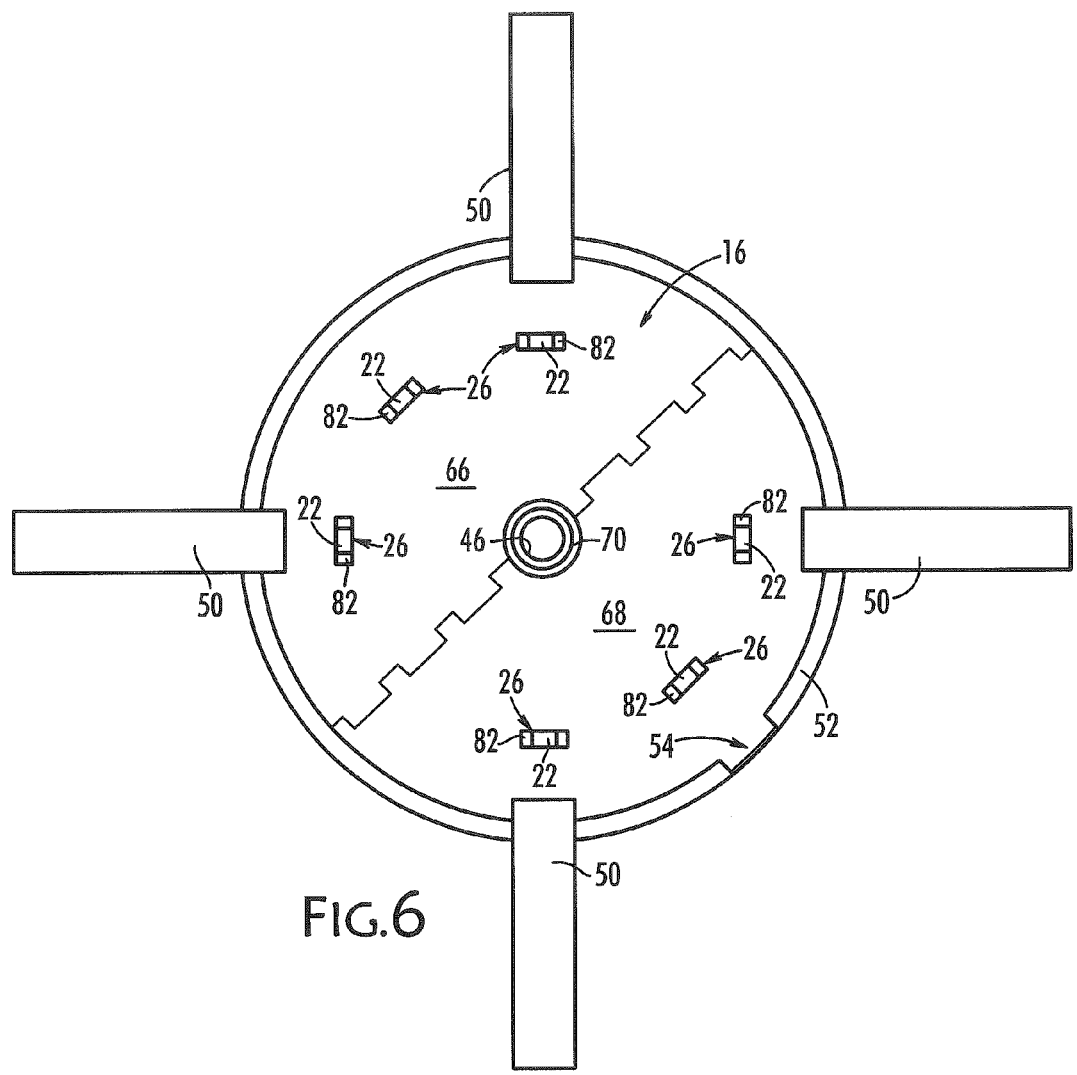
FIG. 6 is a bottom view of the housing showing the gap in the rim that enables the user to add a leg to the tree stand, according to a preferred embodiment of the present invention.

HPTS 10 can be adjusted to accommodate different sizes of artificial trees and can be easily modified to increase stability for the load characteristics of larger trees—in short, making it a universal tree stand, that is, one that can reliably hold a wide range of tree pole diameters and tree heights. HPTS accommodates different sizes of tree poles in part because it permits the use of different numbers and lengths of legs 50. Each leg 50 attaches to housing 12 at its rim 52 just under the housing's curved sidewall 18 and may then be slid along 52 rim to the desired azimuthal position, as best seen in FIG. 4-6. Accordingly, the number of legs 50 used can be changed from a minimum of three to five or more, and legs of longer length can be substituted for shorter ones when a taller tree is selected.

FIG. 6 is a bottom view of housing 12 showing rim 52 which has a notch 54 formed in rim 52 for insertion and removal of legs 50. Notch 54 is wider than the thickness of legs 50 to allow receipt of a leg 50 at notch 54. Side wall 18 at notch 54 is received into an L-shaped slot 56 formed in leg 50, best seen in FIGS. 4 and 5. Leg 50 may then be moved about side wall 18, with side wall 18 and rim 52 sliding within the L-shaped slot 54 until leg 50 is in position on sidewall 18. Legs 50 are designed to fit tightly against the interior and exterior of sidewall 18 but are inserted without the need for tools. Each leg 50 to be used is installed in the same manner and moved to its appropriate annular position, typically equally-spaced with respect to the other attached legs 50. For example, three legs 50 may be spaced 120 degrees apart, 90 degrees apart for four legs; 72 degrees apart for 5 legs, and so forth. This method provides flexibility and strength while making assembly simple. Once installed, each leg 50 is held securely by side wall 18 but still movable in the azimuthal direction along wall 18.

Note that brace 58, extending vertically from leg 50 up the full measure of side wall 18 distributes pressure coming from the end of leg 50 over the full height of side wall 18.

A 'thumb screw' or spring-loaded ball-detent can be added to lock legs 50 into a more permanent position for larger housings 12.

All the weight of the tree in the present HPTS 10 rests on the entire bottom surface of each leg 50. Each leg 50 may have a surface area of 60 square centimeters (10.75 square inches), giving, for example, four legs a total surface area of 240 square centimeters (43 square inches). Most prior art tree stands have less than 60 square centimeters of surface area to distribute the weight of the tree. Furthermore, if additional pressure is put on the tip of a leg 50, that extra pressure is transferred to housing 12 and re-distributed from there across all legs 50.

Legs 50 may be made of plastic, nylon, or steel, although steel is preferred because legs 50 may be made using a simple, four-stage, stamping operation which results in manufacturing costs comparable to molding legs of plastic. The arrangement of legs 50 and their connection to housing 12 is also stronger and, when made of steel, offers significantly more heat dispersion area for radiative and conductive cooling than prior art tree stands.

Bottom plate 16, shown in FIG. 3, may be made in one stamping to yield two identical stamped parts 66, 68, that when rotated and interlocked, form the housing bottom plate. Parts 66, 68, interlock rigidly when a lock ring 70 is placed onto the bottom of a receiver tube 76. The two parts 66, 68, must fit tightly together and against side wall 18 supported by rim 52 for the outer edge of bottom plate 16 to seal against, and in such a way that bottom plate 16 does not move once in place. Bottom plate 16 may be made out of plastic. One part 66 forms one half and two such parts 66, 68, make both halves of bottom plate 16; one part 66 or 68 is reversed to attach them together. Receiver tube 76 is inserted into the hole in the center of bottom plate 16. Once bottom plate 16 is fully installed, lock ring 70 is fitted to lock bottom plate 16 in position. Housing 12 slides over receiver tube 76 and down onto bottom plate 16.

Cooler air for the effective functioning of HPTS 10 is drawn into housing 12 from below bottom plate 16 through lower vents 26 formed therein and that communicate with the air below housing 12, elevated from the floor by legs 50. These air lower vents 26 have no moving parts and are designed to only allow air to enter housing 12, but not exit.

Lower vents 26 may also be made of plastic and are adhered or welded to bottom plate 16. Lower vents 26 pull outside air into housing 12 and curve 90 degrees to direct it clockwise. As the entering air absorbs heat inside housing 12, it expands and proceeds through upper vents 24 of the housing into heat riser housing 44. As this lower-pressure, warm air carries heat out of housing 12, lower vents 26 nearer the floor draw in cooler, denser air, which air flows up and over flow director ramps 82 located just in front of each opening of a lower vent 26, lift the air flow upwards and directing it further upwards, outwards and in a clockwise direction to force the air to flow across the internal, heat-generating electrical components. Air that meets flow director ramps 82 of the lower vents 26, is directed upwards and to inlets 32 of upper vents 24, creating a low pressure zone behind it that draws in more cooler, heavier, outside air. The incoming outside air passes through lower vents 26, using its heavier viscosity and velocity to quickly neutralize the initial counterclockwise flow. This counterclockwise flow only exists momentarily during startup of HTPS 10. Lower vents 26 are thus an important feature of the present invention.

Receiver tube 76, which may be made of steel, is shown in FIGS. 3-5. Receiver tube 76 has an upper lock skirt plate 86 welded to receiver tube 76 for additional strength and for superior thermal coupling between receiver tube 76 and top surface 14 of housing 12 and the tree pole to efficiently dissipate heat generated in housing 12. This mode of heat removal and dissipation assists HPTS 10 when it is covered with a tree skirt and surrounded by presents and otherwise unable to radiate the heat effectively to the air immediately surrounding housing 12.

When a section of a metal artificial tree pole is inserted into receiver tube 76, tube 76, pole, and tree become a large heat sink for the heat generated within housing 12 by electrical components. Heat is not directly removed by housing 12 but by heat pump riser 40 whence it is conducted on to the artificial tree itself for convection and radiation into the room.

Once upper vents 24 begin to vent warm air from inside housing 12 into upper riser 40, they tend to scavenge air from inside housing 12 based on their shape. Air from inside housing 12 is drawn through upper vents 24 with increasing velocity as the air absorbs more heat from electronic components located in housing 12 and the pressure of the thus-expanded air builds. The movement the air in a circular pattern out of housing 12 continues into heat pump riser 40.

The velocity and pressure differential of the air drives it in a circular direction up an aluminum ramp 42 in heat riser housing 44. The air gives up some of its heat to both the upper and lower surfaces of ramp 42 and also to steel receiver tube 76. Riser tube 46 is coupled to the housing 12 via receiver tube skirt 80 that couples receiver tube 76 to housing 12 via its larger surface area for more efficient heat conduction and dispersion from the interior of housing 12 to heat pump riser 40.

Some air passes over the upper vent 24 from the upper vent 24 behind it on housing 12 creating a low pressure area over upper vent 24. The resulting partial vacuum draws air out of housing 12 through exit 34 of upper vent 24. The air in heat riser housing 44 increases in velocity and begins to move up ramp 42. Air moves up and out, but cannot return against the flow of air, so upper vents 24 act as flow check valves without moving parts.

Upper vents 24, which are carried by top surface 14 of housing 12, lie within the perimeter of heat riser housing 44 and they are encompassed by it. They direct the warmed incoming air tangentially to the curved wall on the inside of heat riser housing 44 to establish a clockwise air flow pattern. Upper vents 24 feeding this clockwise flow build up the angular velocity and momentum from the rising flow of air of housing 12.

In addition to directing the warm air into and up heat riser housing 44, the top of each upper vent 24 lifts the air coming from an upper vent 24 behind it. As this air flows over upper vents 24, the pressure in the interior of housing 12 forms an eddy at inlet 32 of upper vent 24, a horizontal vortex, that increase the draw from the interior of housing 12. Thus, the velocity and mass of the air entering heat pump riser 40 increase.

As mentioned above, the heated air, moving clockwise around the interior of housing 12, is in thermal contact with the metal side wall 18 and top surface 14 of housing 12, which radiates absorbed heat to the exterior where it contributes to the thermal forming over heat riser housing 44. Heat is also conducted via the holiday tree pole into the tree so that it radiates more evenly. Additionally, decorative incandescent lamps that may be attached to the limbs of the holiday tree also generate heat and contribute to the formation of that thermal.

The largest outer diameter for receiver tube 76 is 10 cm (2.5 inch). Various sized cylindrical adapters may be used as locks to securely hold the tree pole in place in received tube 76 so each tree pole will be securely held in housing 12. The diameter of receiver tube 76 can be even larger, say, 11 cm (2.75 inch) without modification, but, for still larger diameter tree poles, legs 50 attached to housing 12 may be made longer to keep such trees upright and secure.

The normal outer diameter of receiver tube 76 is 4 cm (1.75 inch). Receiver tube is an important part of HPTS 10 and is sized for the diameter of an artificial tree pole. A top locking cover 90 and lock skirt plate 86, more fully described below, may be selected for the size of the housing 10.

FIGS. 4 and 5 illustrate a pin 96 that cooperates with a pin hole 98 formed in receiver tube lock ring 78 and receiver tube skirt 80. With pin 96, made of steel and spot-welded onto the underside of receiver tube skirt 80, inserted into pin hole 98, the receiver tube skirt 80 and a tree pole inserted into receiver tube 76 cannot rotate with respect to each other.

Skirt 80 may be made of steel and is welded to receiver tube 76, which may also be made of steel so heat transfer between them is good. Inside housing 12, and as best seen in FIG. 5, Lock ring 70 is pushed onto receiver tube 76 thereby capturing the top surface 14. Lock ring 70 is held in place via a lock skirt plate 86 that is locked into receiver tube 76, via a pin 96. Lock ring 70 is also used to hold and restrict bottom plate 16 of housing 12, as will be described more fully below, so all is unified and thereby transfers the load of the tree across housing 12 so the entire configuration with the tree inserted in receiver tube 76 is very stable and secure.

Receiver tube skirt 80 is welded to receiver tube 76 so that it will hold tree poles securely. Lock ring 70 may be made of plastic and be pre-configured for a typical artificial tree pole diameter. HPTS 10 locks top to bottom with side wall 18 between top surface 14 and bottom plate 16.

When a tree pole is inserted into receiver tube 76, the weight of the tree is transmitted through the receiver tube skirt 80 which is welded onto receiver tube 76. Receiver tube 76 is held securely against rotation by a locking pin 96 and form-fitting receiver tube lock ring 78, located on the interior of housing 12, and secures receiver tube 76 to both top surface 14 and bottom plate 16 of housing 12. The tree weight is transmitted through housing 12 to legs 50 via side wall 18 and rim 52, coupling vertically through legs 50. If the tree is out of balance, or pulled over sideways to move it, or being decorated, then an upward, vertical force is exerted on the outer end of one of legs 50, concentrated at the outer tip of leg 50 depending on the angle of the tree. This upward force moves toward housing 12 where its fulcrum point becomes the front, outer, curved, vertical surface of the side wall 18 and the outer surface of leg 50 is against that side wall 18. Accordingly, when a compressive force is applied to side wall 18, the curve of side wall 18 automatically re-distributes that compressive force to resist the compression, and a second, counter-acting force arises due to the fulcrum point now creating a pulling force across the bottom of leg 50 where it joins to rim 52 of side wall 18, which also tries to compress side wall 18.

Because side wall will 18 not compress in response to a lateral force, in part due to its shape and in part, to its steel construction, the energy of that force is transferred up to the interior portion of leg 50, which tries to expand side wall 18 from the interior of housing 12, creating a counter-force in reaction to the original annular force to side wall 18 that cancels out the direct force loading at those points, and redistributes the load across the entire surface of side wall 18, making the design of the present universal tree stand extremely strong.

Referring now to FIGS. 3-5, heat pump riser 40 includes a spiral ramp 42 that is a modified Archimedes' screw formed of heavy gauge aluminum foil and fitting tightly against the curved sides of heat riser housing 44. Ramp 42 has an exterior, perpendicular side wall 104 to direct the air flow and strengthen ramp 42. Ramp 42 has an inner, perpendicular side wall 106, glued to receiver tube 76, to direct the air flow and to support ramp 42. Receiver tube 76 is made of steel and has multiple design features to integrate the HPTS 10 to an artificial tree. As this upper air flow strikes the thin, leading edge of the aluminum ramp 42, it is directed upwards to follow the 1080 degree, three-turn, curved ramp 42 to the top of heat riser housing 44 where it exits the heat pump via vents 48 into the room and out of HPTS 10, forming a thermal that draws out still more heat-laden air.

The heat pump riser 40 with riser housing vents 48 is shown in FIGS. 3-5. Heat pump riser 40, shown in FIG. 6 with riser housing vents 48 and heat riser housing 44 shown in cross section to disclose their operation relative to the upper vents 24 and to explain the integration of the operation of these important features of the overall design and operation of HPTS 10. As can be clearly seen, ramp 42 is a full 1080 degree Archimedes' screw, made out of aluminum tape for lower cost, and formed so as to increase its inherent rigidity. It has a good strength-to-weight ratio, and within its protective housing 44, will withstand normal forces of use and in shipping.

Heat riser housing 44 may be made out of polyvinyl chloride and which may be scrap plastic reinforced with virgin nylon to add considerable strength but without affecting weight or other operational characteristics, making its cost low.

Heat riser housing 44 has a central hole 62 formed in it to receive the artificial tree pole. The contact between heat riser housing 44 and the tree pole conducts heat from housing 44 to the pole. Heated air ascending ramp 42 is also transferred to the tree pole via the ramp and from the pole throughout the tree. Heat riser housing 44 may have plural annular riser housing vents 48 from which the heated air from housing 12 and heat pump riser 40 is exhausted into the surrounding room.

Heat riser housing 44 may be glued onto top surface 14 of housing 12 using thermally-conducting glue. Furthermore, it may be held in position by the tight fit of housing 44 to receiver tube 76.

Heat riser housing 44 can be metal-plated with a shaded, mirrored chrome finish to make HPTS 10 expensive-looking while simultaneously providing a surface that radiates heat.

When the electronic components inside housing 12 begin to generate heat, the air in housing 12 starts to expand, increasing pressure inside housing 12 and forming air currents. The rising heat moves upward through upper vents 24 of housing 12 which direct the airflow in a clockwise direction into heat riser housing 44. Hot air coming out of upper vents 24 also accumulates angular momentum as it follows the curvature of the heat riser housing 44. The pressure of the hot air increases, forcing it up ramp 42 of heat pump riser 40.

Because the ramp 42 is made of aluminum, it aggressively absorbs heat from the moving hot air mass while guiding the warm air upwards, following the curved, upward path of ramp 42. Ramp 42, in thermal contact with receiver tube 76, transfers heat to receiver tube 76 and thence to the tree pole. As the warm air moves upward, the tree picks up the heat and radiates it into the room. The moving air mass carrying the heated air out of housing 12, eventually reaches the top of the heat pump riser 40, where it exits the riser housing vents 48 located at the top of heat riser housing 44. By the time the hot air gets to vents 48, most of the heat in that air has been absorbed into the structure of HPTS, and it can simply flow out of the heat pump riser 40.

Inside the heat riser housing 44, air pressure from the hydraulic action of the size of upper vents 24 and housing 12 continues to build enabling the air to move up through heat riser housing 44. The air moves more rapidly upwards while giving up heat to heat pump riser 40 and heat riser housing 44, which transfer heat to the tree pole and thence into the tree. The air exhausts through the riser housing vents 48.

Thus, heat is driven away from heat sources, namely, electronic components operating in housing 12. Meanwhile, cool air is pulled into housing 12 via lower vents 26 in bottom plate 16. As air enters housing 12 through vent 26, it flows clockwise around the internal perimeter of housing 10, transferring heat to its metal side wall 18 and legs 50. This circulation increases in velocity so as this air expands and the pressure increases, air is eventually forced from housing 12 and the process described above continues. Lower vents 26 of bottom plate 16 of housing 12 allow air to flow in easily and to create an air curtain that blocks air from exiting bottom plate 16 through lower vents 26.

No moving parts and no power source is required; the energy for operation is exclusively the waste heat from the electronic components.

Those skilled in the art of holiday decorations and artificial trees in particular will appreciate that many substitutions and modifications may be made to the embodiments disclosed herein without departing from the spirit and scope of the present invention, which is defined by the present claims.

What is claimed is:

1. A heat pump tree stand for housing electronic components supporting decorative lighting on a holiday tree, said holiday tree having a tree pole, said heat pump tree stand comprising:
    (a) a housing having an interior configured for housing electronic components, said housing having a top surface, a side wall and a bottom plate which together define said interior, said top surface having a central hole and carrying plural upper vents;
    (b) a heat riser housing carried on said top surface of said housing and having an interior, said heat riser housing encompassing said plural upper vents of said housing so that said interior of said heat riser housing is in fluid communication with said interior of said housing via said plural upper vents, said heat riser housing having a central hole and plural riser housing vents, wherein said heat riser housing carries a curved ramp for guiding air received from said plural upper vents of said housing in an upward circular path to said heat riser housing vents;
    (c) plural legs carried by said housing; and
    (d) a receiver tube carried by said housing and said heat riser and passing through said central hole in said housing and said central hole of said heat riser housing, said receiver tube configured to receive a tree pole, wherein when heat is generated by said electronic components in said housing, said heat is absorbed by air passing from said housing through said upper vents into said heat riser housing and through said heat riser housing vents without assistance of fans or motors, said legs being configured so that, when a tree pole is inserted in said receiver tube, said legs support said tree pole.

2. The heat pump tree stand of claim 1, wherein said legs elevate said bottom plate of said housing and wherein said bottom plate includes plural lower vents to admit air so that said air flows from said exterior of said housing below said bottom plate into said housing and thence through said plural upper vents into said heat riser housing and out said heat riser housing vents.

3. The heat pump tree stand of claim 2, wherein said lower vents in said bottom plate are configured to establish a circular flow of air in said housing.

4. The heat pump tree stand of claim 1, wherein said plural upper vents in said housing are configured to establish a circular flow of air from said housing.

5. The heat pump tree stand of claim 1, wherein said curved ramp is in thermal contact with said heat riser housing and a riser tube.

6. The heat pump tree stand as recited in claim 1, wherein said ramp has an inner wall attached to said receiver tube and outer wall attached to said heat riser housing.

7. The heat pump tree stand as recited in claim 1, wherein said side wall of said housing has a rim, said rim extending around a major portion of said side wall but leaving a notch in said rim.

8. The heat pump tree stand as recited in claim 1, wherein each leg of said plural legs has an L-shaped slot formed therein, wherein one portion of said L-shaped slot receives said rim and said remaining portion of said L-shaped slot receives said side wall so that said each leg can be added to said housing at said notch and slid around said side wall over said rim into position on said side wall.

9. The heat pump tree stand as recited in claim 1, wherein said bottom plate is formed in two parts, said two parts interlocking to form said bottom plate.

10. The heat pump tree stand as recited in claim 1, wherein said receiver tube comprises a riser tube and a lock ring and wherein said riser tube and said lock ring are locked to said housing to prevent rotation of said receiver tube with respect to said housing.

11. A heat pump tree stand for use with a tree, said tree having a tree pole, said heat pump tree stand comprising:
(a) a housing having an interior configured for holding electronic components, said housing having a top surface, a side wall and a bottom plate which together define said interior, said top surface having a central hole and plural radial holes;
(b) plural upper vents, each upper vent being carried in a radial hole of said plural radial holes, said each upper vent being configured to receive air from said interior of said housing and direct it from said housing tangentially;
(c) plural legs carried by said housing;
(d) a heat riser housing carried on said top surface of said housing and having an interior and a side wall, said heat riser housing encompassing said plural upper vents of said housing so that said interior of said heat riser housing is in fluid communication with said interior of said housing via said plural upper vents, said heat riser housing having a central hole and plural riser housing vents, said air moving tangentially along said side wall of said heat riser housing;
(e) a ramp carried within said heat riser housing; and
(f) a receiver tube carried by said housing and said heat riser housing, said receiver tube extending through said central hole in said housing and said central hole of said heat riser housing, wherein when heat is generated by said electronic components in said housing, said heat is absorbed by air passing over said electrical components and venting from said housing through said upper vents into said heat riser housing, flowing up said ramp and through said heat riser housing vents without assistance of fans or motors, said receiver tube configured to receive a tree pole, and said legs being configured to support said housing with a tree pole received in said receiver tube.

12. The heat pump tree stand as recited in claim 11, wherein said receiver tube carries a receiver tube skirt formed to engage said top surface of said housing.

13. The heat pump tree stand as recited in claim 11, wherein said receiver tube has a riser tube and a lock ring, said riser tube dimensioned to fit in said lock ring.

14. The heat pump tree stand as recited in claim 13, wherein said receiver tube has a receiver tube skirt and said lock ring has a lock skirt plate, said receiver tube skirt and said lock skirt plate engaging said top surface of said housing.

15. The heat pump tree stand as recited in claim 14, wherein said receiver tube skirt of said receiver tube carries a pin and said lock skirt plate of said riser tube carries a hole, said hole dimensioned to receive said pin and to hold said receiver tube skirt of said receiver tube and said riser tube in registration so that said receiver tube does not rotate with respect to said riser tube.

16. The heat pump tree stand as recited in claim 11, wherein said side wall has a rim with a notch in said rim.

17. The heat pump tree stand as recited in claim 16, wherein each leg of said plural legs has a L-shaped slot formed therein, said L-shaped slot dimensioned to receive said side wall and said rim.

18. The heat pump tree stand as recited in claim 11, wherein said each upper vent of said plural upper vents has an inlet and an opposing outlet, and wherein said vent snaps into position in said radial hole with said inlet inside said housing and said outlet outside said housing.

19. The heat pump tree stand as recited in claim 11, wherein said each upper vent of said plural upper vents is formed to direct air from said housing both tangentially and upwardly.

* * * * *